US 6,569,380 B2

(12) United States Patent
Lim et al.

(10) Patent No.: US 6,569,380 B2
(45) Date of Patent: May 27, 2003

(54) ENCLOSURE FOR A SEMICONDUCTOR DEVICE

(75) Inventors: Kay-Leong Lim, Singapore (SG);
Lye-King Tan, Singapore (SG);
Eng-Seng Tan, Singapore (SG)

(73) Assignee: Advanced Materials Technologies Pte, Ltd., Singapore (SG)

( * ) Notice: Subject to any disclaimer, the term of this patent is extended or adjusted under 35 U.S.C. 154(b) by 0 days.

(21) Appl. No.: 09/940,049

(22) Filed: Aug. 27, 2001

(65) Prior Publication Data

US 2003/0039571 A1 Feb. 27, 2003

(51) Int. Cl.$^7$ ................................................. B22F 7/06
(52) U.S. Cl. .................. 419/5; 419/6; 419/36; 428/548
(58) Field of Search .................... 419/5, 6, 36; 428/548

(56) References Cited

U.S. PATENT DOCUMENTS

| | | | | |
|---|---|---|---|---|
| 4,722,824 A | * | 2/1988 | Wiech, Jr. ...................... 419/6 |
| 5,393,484 A | * | 2/1995 | Seyama et al. ................ 419/37 |
| 5,878,322 A | | 3/1999 | Polese .......................... 419/38 |
| 5,886,407 A | | 3/1999 | Polese et al. ................. 257/706 |
| 6,033,788 A | * | 3/2000 | Cawley et al. .................. 419/2 |
| 6,075,701 A | | 6/2000 | Ali et al. ..................... 361/704 |
| 6,114,048 A | * | 9/2000 | Jech et al. ................... 228/246 |
| 6,248,290 B1 | * | 6/2001 | Kuwabara ....................... 419/6 |
| 6,315,945 B1 | * | 11/2001 | Macki et al. ................... 419/5 |
| 6,322,746 B1 | * | 11/2001 | LaSalle et al. ................. 419/6 |

FOREIGN PATENT DOCUMENTS

JP    7321261 A    12/1995    ......... H01L/23/373

* cited by examiner

*Primary Examiner*—Ngoclan Mai
(74) *Attorney, Agent, or Firm*—George O. Saile; Stephen B. Ackerman; Douglas R. Schnabel

(57) ABSTRACT

A method to form a combined enclosure and heat sink structure for a semiconductor device is achieved. A first feedstock comprising a first mixture of powdered metal materials, lubricants, and binders is prepared. A second feedstock comprising a second mixture of powdered metal materials, lubricants, and binders is prepared such that the difference between the sintering shrinkage of each of the first and second feedstocks is less than 1%. The first and second feedstocks are pressed to form a first green part having an enclosure shape and a second green part having a heat sink shape. The lubricants and the binders from said first and second green parts are removed to form a first powdered skeleton and a second powdered skeleton. The first and second powdered skeletons are sintered to complete the combined enclosure and heat sink structure. The first and second powdered skeletons are in intimate contact during the sintering. Optionally, at least one hollow cooling channel is formed in the combine structure by burning away a fugitive plastic structure during the sintering process.

43 Claims, 11 Drawing Sheets

ENCLOSURE FOR A SEMICONDUCTOR DEVICE

The present application is related to applicant's Co-pending application, Ser. No. 09/733527 (AMT-00-002), filed Dec. 11, 2000, entitled "Method to Form Multi-Material Components."

BACKGROUND OF THE INVENTION (1) Field of the Invention

The invention relates to an enclosure for a semiconductor device, and more particularly, to a combined enclosure and heat sink formed without an adhesive layer.

(2) Description of the Prior Art

Many electronic devices, such as integrated circuits, solid state power amplifiers, and antennas produce substantial amounts of heat when in service. The heat must be re-distributed and, ultimately, conducted away, or the resulting temperature rise may result in the maximum operating temperature limit of the electronic device being exceeded. Therefore, it is often necessary to provide a heat sink structure to conduct away heat from the electronic enclosure used to house the integrated circuit.

Referring now to FIG. 1, an exemplary, prior art semiconductor enclosure 14 with a heat sink 18 attached using an adhesive layer 22 is illustrated. The integrated circuit device 10 is secured to the enclosure 14. The enclosure 14 typically comprises a material with a low coefficient of thermal expansion to match that of the semiconductor material of the integrated circuit 10. In addition, the enclosure must provide protection against moisture and other atmospheric conditions. The enclosure may also need to prevent interference between internal and external signals. By comparison, the heat sink 18 typically comprises a material having a high thermal conductivity and, typically, including heat dissipating fins 24. However, the heat sink 18 and enclosure 14 may have very dissimilar coefficients of thermal expansion. During thermal cycling events, wherein the temperature of the structure rises and falls by a substantial amount, large thermal stresses are created in the adhesive layer 22. Thermal cracking may occur in the adhesive layer 22 due to this thermal cycling.

Referring now to FIG. 2, a cross sectional view of a prior art enclosure 34 with a heat sink 42 attached using an adhesive layer 38 is illustrated. The enclosure is attached to a printed circuit board (PCB) 50. In this example, the integrated circuit chip 30 is sealed with a glass layer 54. Optical fiber 46 is connected to the chip 30 through the enclosure 34. Once again, thermal cycling can cause failure of the adhesive layer 38 to heat sink 42 interface 58.

Several prior art inventions describe packaging enclosures and heat sinks. Japanese Patent 7,321,261A discloses a low-cost tungsten alloy heat sink. The complex shaped, tungsten alloy heat sink demonstrates good heat radiation and thermal conductivity. However, the heat sink must still be bonded to the electronic device to function effectively. U.S. Pat. Nos. 5,878,322 and 5,886,407 disclose heat sinks for microelectronics packages that are formed using powder compacting. However, an adhesive is still needed to bond the heat sink to the enclosure. U.S. Pat. No. 6,075,701 discloses an electronic structure having an embedded pyrolytic graphite heat sink material to enhance the heat dissipating performance. However, the processing parameters limit the range of materials that may be used for the enclosure, or casing. Only low melting point metals, such as aluminum, are compatible with the hot isostatic pressing process. Further, additional heat treatment processing, such as quenching and aging, must be performed to achieve optimum performance.

SUMMARY OF THE INVENTION

A principal object of the present invention is to provide an effective and very manufacturable method to form an enclosure for a semiconductor device.

A further object of the present invention is to provide a method for forming an enclosure combined with a heat sink, without a adhesive layer therebetween, to reduce cost and to improve reliability.

A still further object of the present invention is to provide a method to form a combined enclosure and heat sink while maintaining low thermal expansion in the enclosure and high thermal conductivity in the heat sink.

Another further object of the present invention is to provide a method to form a combined enclosure and heat sink where a hollow, cooling channel is formed in the heat sink to further improve the heat sink thermal conductivity.

Another still further object of the present invention is to provide a method to form a combined enclosure and heat sink with a hollow, cooling channel where the cooling channel is formed by the same sintering process used to form the combined structure.

Another object of the present invention is to provide an improved enclosure and heat sink structure.

In accordance with the objects of this invention, a method to form a combined enclosure and heat sink structure for a semiconductor device is achieved. A first feedstock comprising a first mixture of powdered metal materials, lubricants, and binders is prepared. A second feedstock comprising a second mixture of powdered metal materials, lubricants, and binders is prepared such that the difference between the sintering shrinkage of each of the first and second feedstocks is less than 1%. The first and second feedstocks are pressed to form a first green part having an enclosure shape and a second green part having a heat sink shape. The lubricants and the binders from the first and second green parts are removed to form a first powdered skeleton and a second powdered skeleton. The first and second powdered skeletons are sintered to complete the combined enclosure and heat sink structure. The first and second powdered skeletons are in intimate contact during the sintering. Optionally, at least one hollow cooling channel is formed in the combine structure by burning away a fugitive plastic structure during the sintering process.

Also in accordance with the objects of the present invention, a combined enclosure and heat sink structure for a semiconductor device is achieved. The structure comprises an enclosure comprising a first material and a heat sink comprising a second material. The enclosure and the heat sink are coupled together by a sintering process. Optionally, the combined enclosure and heat sink structure contains at least one, hollow, cooling channel.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel combined enclosure and heat sink for a semiconductor device of the present invention. A method of forming a combined enclosure and heat sink structure comprising two materials is achieved. The two materials are formed and adjoined using a novel sintering process without use of an adhesive layer. An embodiment of the method and structure includes a means of creating hollow, cooling channels in the heat sink to further improve performance. It should be clear to those experienced in the art that the present invention can be applied and extended without deviating from the scope of the present invention.

Figure 1:
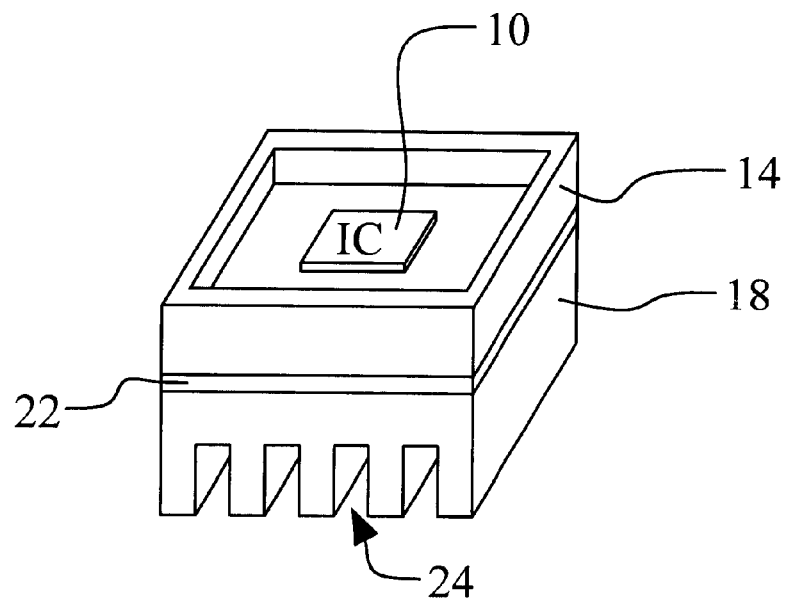
FIG. 1 illustrates an exemplary, prior art semiconductor enclosure with a heat sink attached using an adhesive layer.
Figure 2:
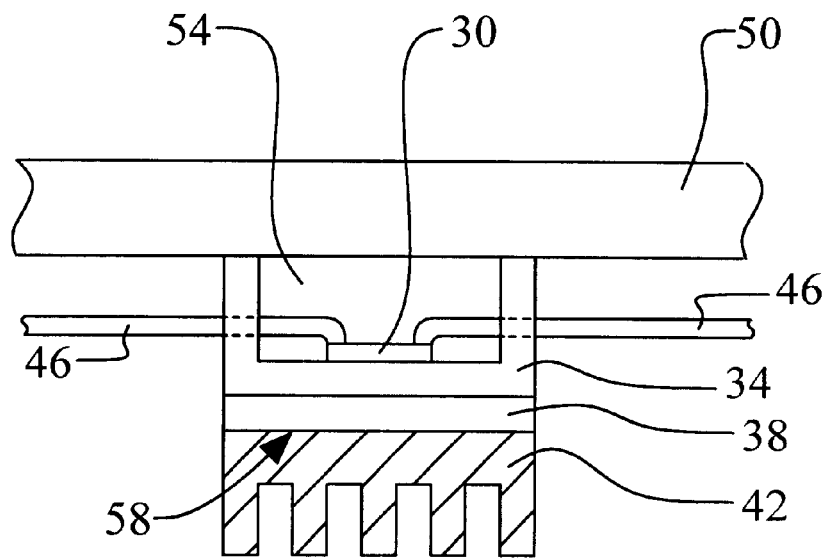
FIG. 2 illustrates a cross sectional view of a prior art enclosure with a heat sink attached using an adhesive layer. The enclosure is attached to a printed circuit board (PCB).
Figure 3:
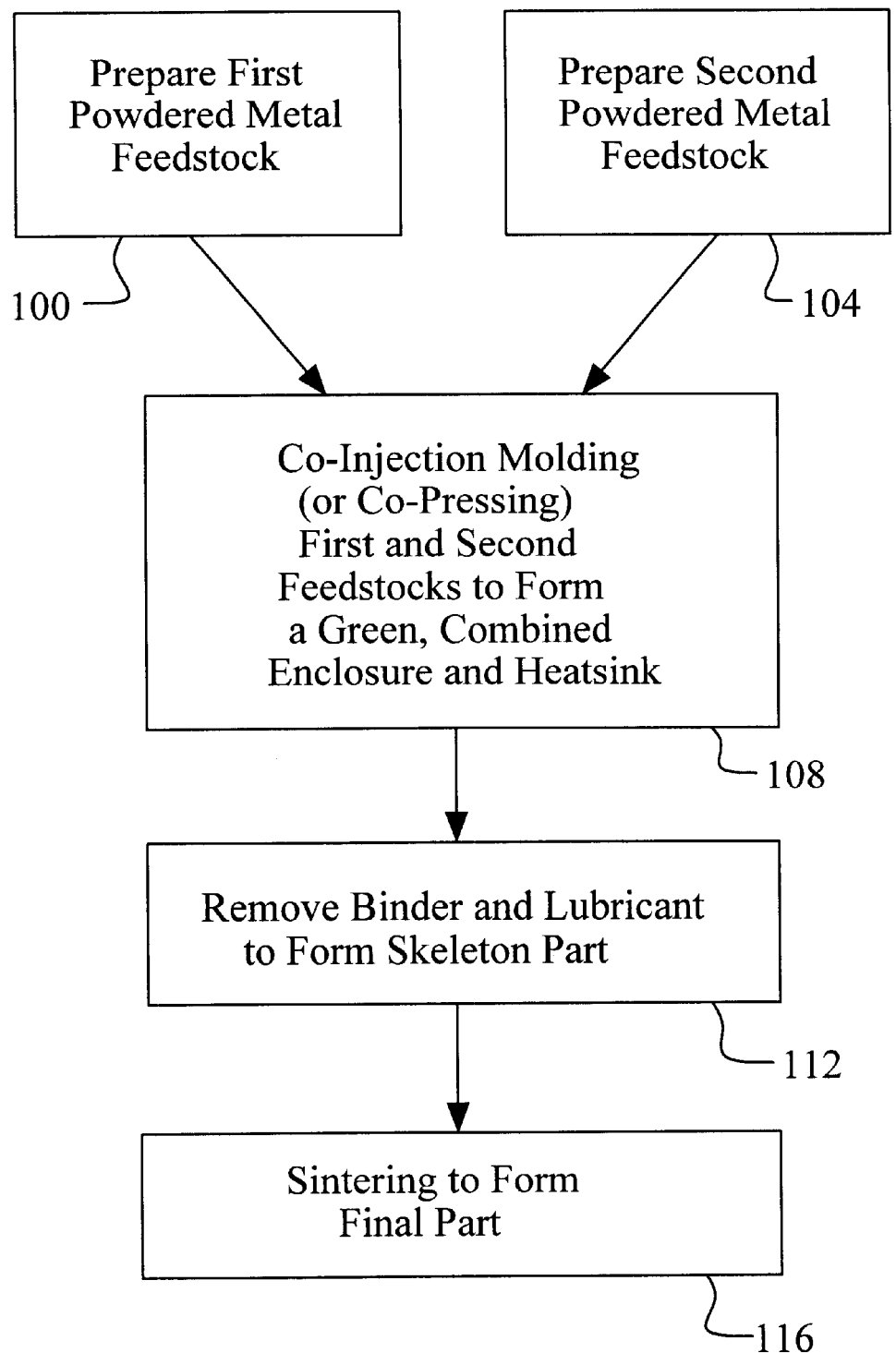
FIGS. 3 through 6 illustrate a first preferred embodiment of the present invention, showing the method of forming the combined enclosure and heat sink structure.

Referring now to FIG. 3, a first preferred embodiment of the present invention, showing the method of forming the combined enclosure and heat sink structure, is illustrated. The method is a form of the art known as powder metallurgy. In powder metallurgy, a powdered form of a metal is molded and, typically, pressed to form a structure. The part is then typically sintered to augment the bonding between particles and to strengthen the powder metal compact.

Referring again to FIG. 3, a first powdered metal feedstock is prepared in step 100. A second powdered metal feedstock is prepared in step 104. As is well known to those skilled in the art, the first step in preparation is to provide the required material in powdered form. This powder, typically a metal powder, may be obtained in a number of ways well established in the art. For example, a reduction process can convert refined oar, mill scale, or prepared oxides into a powdered metal, such as in the case of sponge iron. Powdered metal material may also be created by mechanical milling and grinding of a pure metal stock.

In the present invention, the first mixture of powdered materials will be subsequently formed into an enclosure structure for an integrated circuit. The first mixture of powdered materials is therefore selected to display a first set of properties, and more particularly, a thermal coefficient of thermal expansion that is substantially similar to that of the integrated circuit device. Preferably, the first mixture of powdered materials exhibits a coefficient of thermal expansion of between about 0.5 $\mu$m/m° C. and about 25 $\mu$m/m° C. in the final structure. In addition, it is important that the final structure exhibits excellent strength, protection from atmospheric intrusion, such as water, and electrical isolation. To achieve these properties, the first mixture of powdered materials preferably comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar. Kovar is a trademark of Carpenter, Inc., and has a chemical composition of about 30% nickel, about 15% cobalt, and the balance iron.

This first mixture of powdered materials is combined with lubricants and binders to form the first feedstock in step 100. Essentially any organic material, which will decompose under elevated temperatures without leaving a residue that will be detrimental to the properties of the metal articles, can be used. Preferred materials are various organic polymers, such as stearic acids, micropulvar wax, paraffin wax, and polyethylene. Stearic acid particularly serves as a lubricant while all the other materials may be used as binders. It important to note that the amount and nature of the binder and lubricant that is added to the powder will determine the viscosity of the feedstock and the amount of shrinkage that will occur during the subsequent sintering step.

In the present invention, the second mixture of powdered materials, prepared in step 104, will be subsequently formed into a heat sink for the combined enclosure and heat sink structure. The second mixture of powdered materials is therefore selected to display a second set of properties, and more particularly, a high thermal conductivity to pull heat generated in the integrated circuit away from the IC device. Preferably, the second mixture of powdered materials exhibits a coefficient of thermal conductivity of between about 50 W/mK and about 450 W/mK in the final structure. In addition, it is important that the final heat sink exhibit excellent strength. To achieve these properties, the second mixture of powdered materials preferably comprises one or more materials selected from the group consisting of: aluminum, copper, tungsten-copper, molybdenum-copper, aluminum nitride (ceramic), beryllium, magnesium, silicon, tungsten, molybdenum, tin, zinc, gold, and silver. This second mixture of powdered materials is then combined with the aforementioned lubricants and binders to form the second feedstock in step 104. In addition, materials such as pyrolytic graphite could be used. However, the coefficient of thermal conductivity for these materials is above 1950 W/mK.

It is important to note that forming a successful bond between the enclosure and the heat sink during the sintering process depends heavily on two factors. First, the shrinkage of the enclosure and the heat sink, during sintering, must be closely matched. The enclosure and the heat sink shrinkage cannot differ, one from another, by more than a critical amount. Preferably, the amount that the feedstocks shrink after sintering differs, one from the other, by less than about 1%. Second, the powdered materials used to form the first and second feedstocks in steps 100 and 104 must share similar characteristics such as particle shape, texture, and size distribution. Preferably, the tap sizes of the two powders should not differ by more than about 30% while the mean particle size for both powders should be in the range of between about 1 micron and 40 microns.

Figure 4:
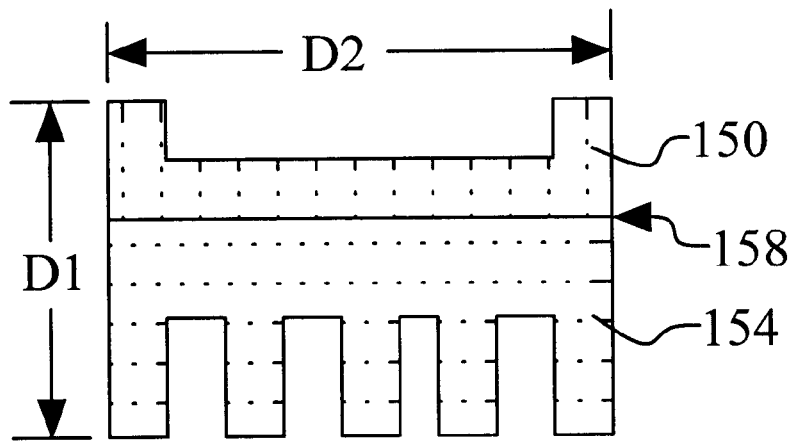

Referring again to FIG. 3, the first and second feedstocks are co-injected into a mold to form a green, combined enclosure and heat sink structure in step 108. Referring now to FIG. 4, the green, combined enclosure and heat sink structure is shown in cross section. The enclosure part 150 of the structure comprises the first feedstock molded and pressed into the enclosure shape. The heat sink part 154 of the structure comprises the second feedstock molded and pressed into the heat sink shape. As an important feature, the enclosure 150 and heat sink 154 are in intimate contact with one another along the boundary shown by 158.

The pre-sintering structure is said to be green since it still contains the binders and lubricants. The part has sufficient mechanical strength to maintain its shape during handling. At this stage, the structure is substantially larger than it will be after sintering as shown by the dimensions, D1 and D2.

Referring again to FIG. 3, the binder and lubricant are removed to form a skeleton part in step 112. The binder may be removed by heating or through the use of a solvent. The resulting skeleton part is then placed in a sintering furnace. The structure is then sintered in step 116. The sintering step causes the first and second feedstocks to bond at the interface and greatly increases the mechanical strength of the powdered metal materials. The sintering step is preferably performed at a temperature of between about 1000° C. and 1600° C. for between about 30 minutes and 180 minutes. The exact temperatures and times depend upon the materials being sintered. More preferably, the sintering step is performed in an atmosphere of hydrogen, hydrogen/nitride mixture, or in a vacuum.

Figure 5:
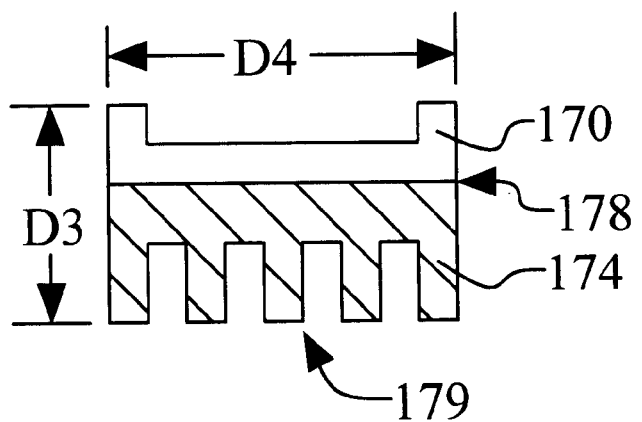

Referring now to FIG. 5, the resulting structure is illustrated. The structure comprises, first, the enclosure 170 comprising the first material having the first set of properties. Second, the heat sink 174 comprises the second material having the second set of properties. The enclosure 170 and the heat sink 174 are intimately connected to form the combined enclosure and heat sink structure. No materials are present at the boundary 178 between the first material and the second material.

The sintering process causes substantial shrinkage in the structure as shown by D3 and D4. D3 is smaller than D1 of FIG. 4. D4 is smaller than D2 of FIG. 4. It is because of this substantial shrinkage that the shrinkage differential between the first and second feedstocks must be so closely controlled. Referring again to FIG. 5, the heat sink section 174 of the first preferred embodiment structure comprises a fin design that extends the width of the structure.

Figure 6:
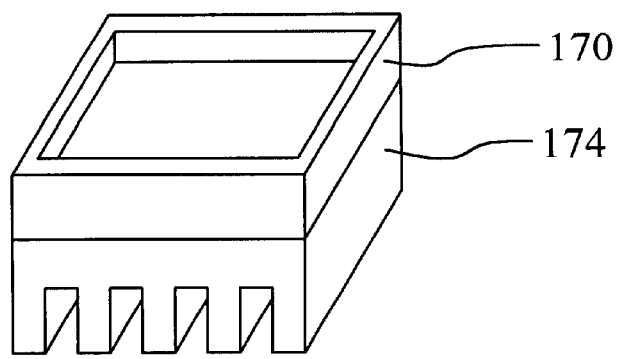

Referring now to FIG. 6, an isometric view of the completed structure is shown. The enclosure 170 comprises a structural box with an opening into which the integrated circuit can be placed and bonded. A sealant and/or encapsulating cover can then be placed over the opening in the enclosure if needed. The heat sink 174 is permanently bonded to the enclosure 170 by the novel process.

Figure 7:
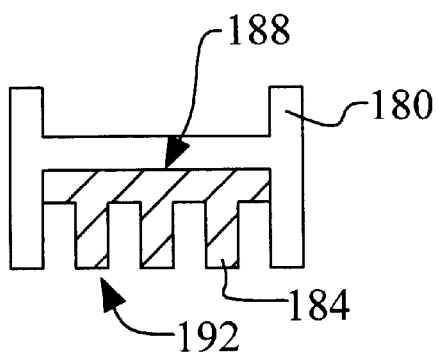
FIGS. 7 and 8 illustrate a second preferred embodiment of the present invention, showing a recessed heat sink.
Figure 8:
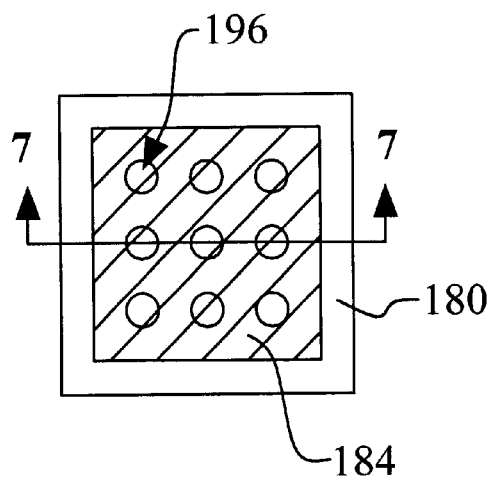

Referring now to FIG. 7, a second preferred embodiment of the structure is shown. In this embodiment, the heat sink 184 is recessed into the enclosure 180 material. This structure is formed using the same method as the first embodiment but with a different mold configuration. Further, the heat sink fins of the first embodiment may be replaced with cylinders 192. Referring now to FIG. 8, a bottom view of the structure is shown. The heat sink insert 184 comprises an array of cylinders 196. Many other configurations and designs of the combined enclosure and heat sink structure of the present invention are possible using the novel method.

Figure 9:
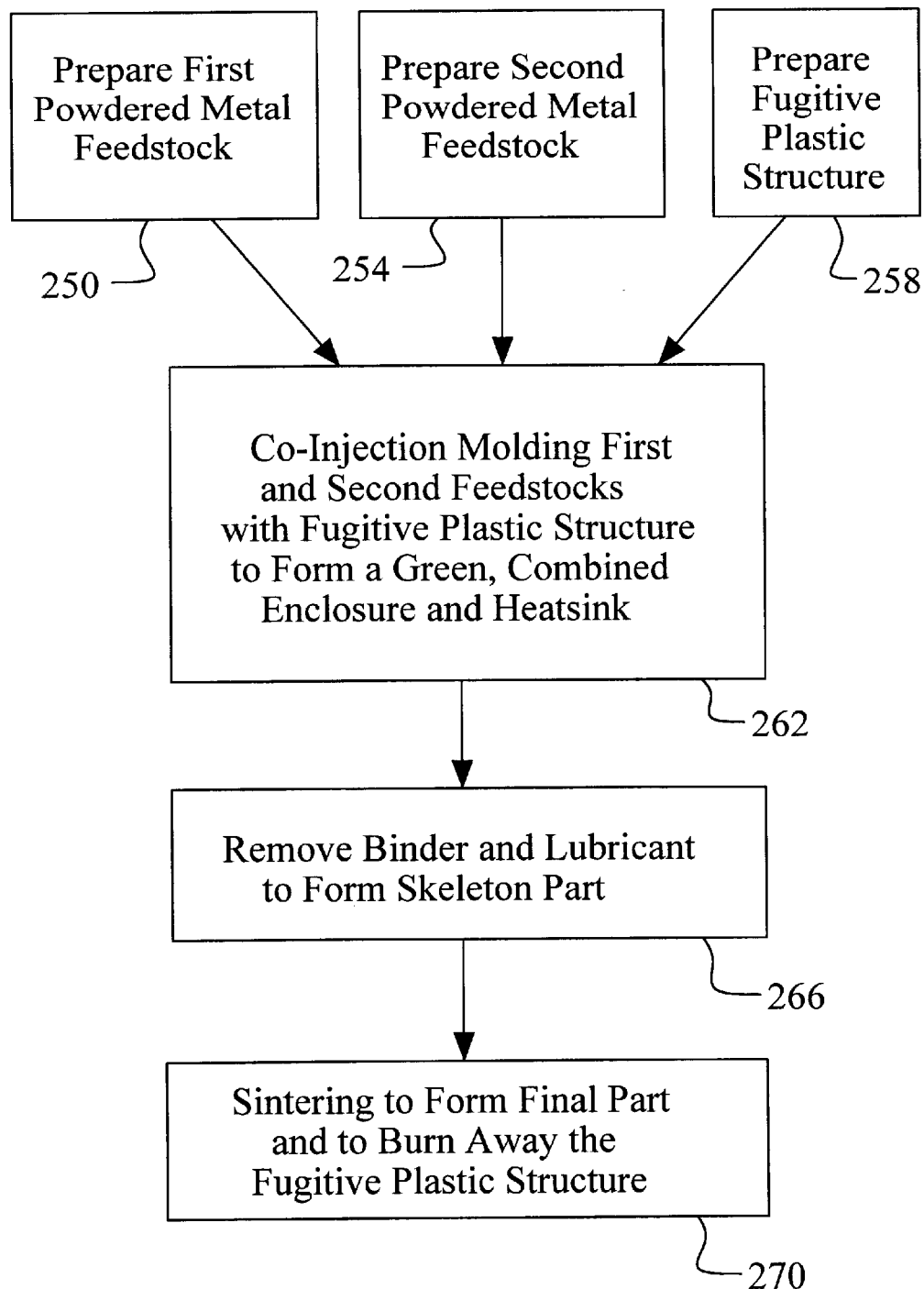
FIGS. 9 through 13 illustrate a third preferred embodiment of the present invention, showing a method of forming a hollow, cooling channel in the heat sink.

FIGS. 9 through 13 illustrate a third preferred embodiment of the present invention, showing a method of forming a hollow, cooling channel in the combined enclosure and heat sink. Referring particularly now to FIG. 9, this method is shown. The first and second feedstocks are prepared in steps 250 and 254. The preparation steps for the first and second feedstocks are substantially the same as in the first embodiment. Once again, the first feedstock will be subsequently formed into the enclosure, while the second feedstock will be formed into the heat sink.

As an important addition to the above described method, the third preferred embodiment includes a novel method for forming at least one hollow, cooling channel within either or both of the enclosure and the heat sink. A cooling channel will allow a fluid, such as oil, to flow through the heat sink or enclosure to thereby provide an additional means of removing heat from the device during high power dissipation events.

Figure 10:
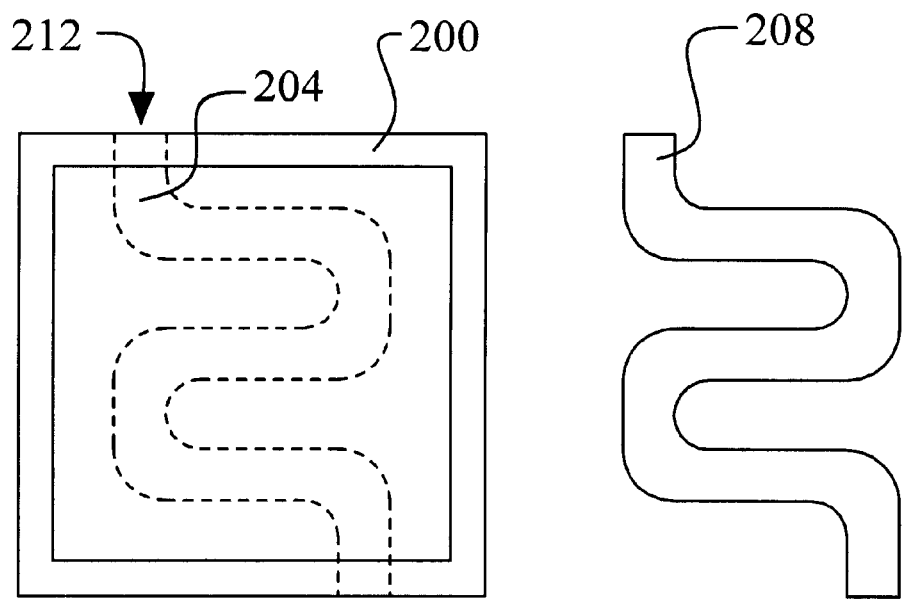

The novel method of the present invention utilizes a fugitive plastic structure to achieve the hollow, cooling channel. This fugitive plastic structure is prepared in step 258. Referring now to FIG. 10, an example of a fugitive plastic structure is shown as 208. This structure comprises a material that can first be impregnated into the feedstock in a predictable spatial arrangement. The fugitive plastic structure then needs to maintain its shape during the molding and pressing step. Finally, the fugitive plastic structure must be capable of being vaporized, or burned away, during the sintering step without leaving a residue. Once burned away, the hollow, cooling channel remains where the fugitive plastic structure had been. To achieve these objectives, the fugitive plastic structure preferably comprises a plastic material selected from the group consisting of: thermosetting polymers, thermoplastic polymers, cellulose, wax, gelatin, and glycol. Referring again to FIG. 9, the fugitive plastic structure may be prepared in step 258 using any of the methods well known in the art to form plastic parts, including, for example, plastic injection molding.

If the first embodiment process is used, the first and second feedstocks and the fugitive plastic structure are co-injected into a mold to form a green, combined enclosure and heat sink structure in step 262. Alternatively, any of the other methods herein disclosed will work as long as the plastic can be encapsulated in the enclosure, in the heat sink, or in both, prior to the sintering step. Referring again to FIG. 10, a top view of the green, combined enclosure and heat sink structure is shown as 200, 204, and 212. The top view shows the green, enclosure section 200. A fugitive plastic structure 208 is impregnated into the heat sink and shown in hidden view as 204. The fugitive plastic structure 204 crosses the combined enclosure and heat sink structure. Preferably, two endpoints of the fugitive plastic structure 204 are exposed at the exterior surface of the heat sink shape as shown by detail 212. Alternatively, a fugitive plastic structure 204, having multiple endpoints or a more complex shape, could be used.

Figure 11:
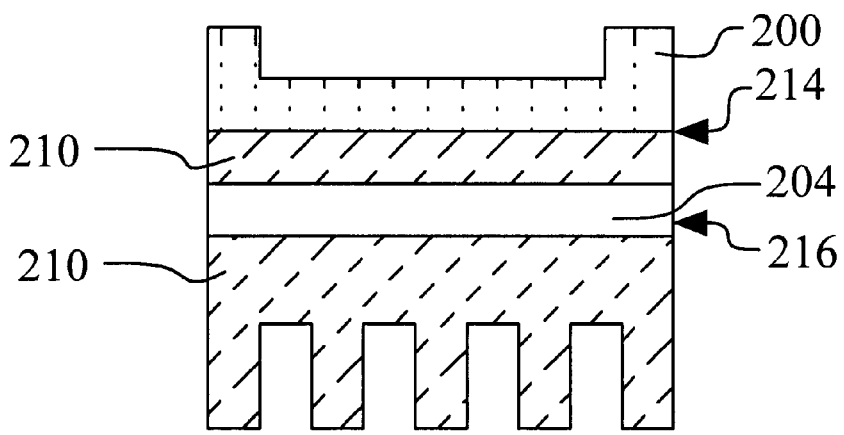

Referring now to FIG. 11, a cross sectional view of the green, combined enclosure and heat sink structure of the third embodiment is illustrated. The fugitive plastic structure 204 extends through the heat sink 210 to each edge 216 of the structure. The fugitive plastic structure 204 is spaced away from the interface 214 between the first feedstock enclosure 200 and the second feedstock heat sink 210.

Referring again to FIG. 9, the binder and lubricant are removed to form a skeleton part in step 266. The binder may be removed by heating or through the use of a solvent. The resulting skeleton part is then placed in a sintering furnace. The structure is then sintered in step 270. The sintering step causes the first and second feedstocks to bond at the interface and greatly increases the mechanical strength of the powdered metal materials. In addition, the fugitive plastic structure is vaporized at the sintering temperature.

Therefore, the hollow, cooling channel is formed in the heat sink. The sintering step is preferably performed at a temperature of between about 1000° C. and 1600° C. for between about 30 minutes and 180 minutes. Once again, the exact temperatures and times will depend upon the materials being sintered. More preferably, the sintering step is performed in an atmosphere of hydrogen, hydrogen/nitride, or in a vacuum.

Figure 12:
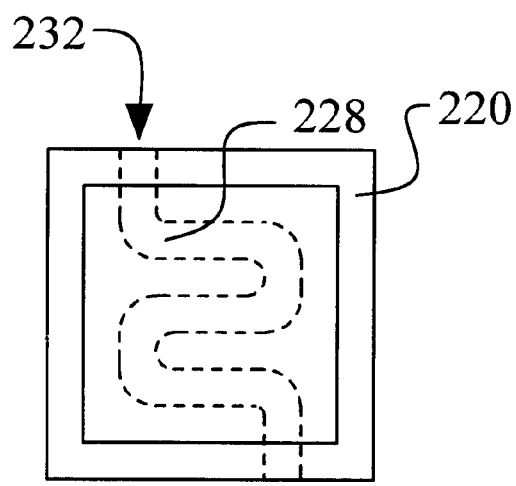

Referring now to FIG. 12, a top view of the resulting structure is illustrated. The sintering step has again caused substantial shrinkage in the size of the structure as shown by the enclosure 220. Likewise, the cooling channel 228 formed by the now consumed plastic is smaller than the original fugitive plastic structure. The cooling channel 228 is formed within the combined enclosure and heat sink. In this example, the channel 228 is in the heat sink 224. The cooling channel 228 has openings 232 at the edges of the combined structure for inlet and outlet of cooling liquid.

Figure 13:
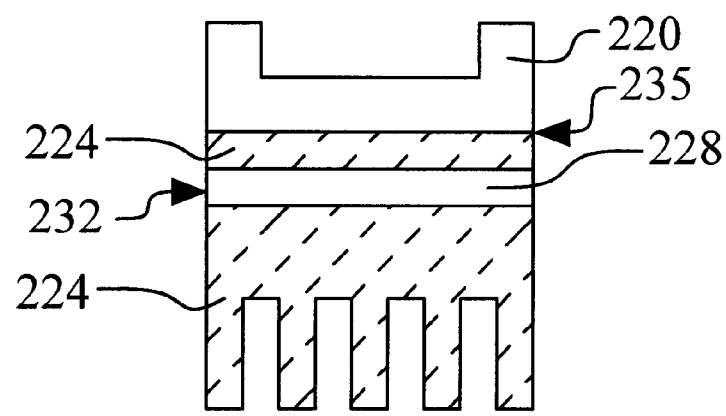

Referring now to FIG. 13, a cross section of the resulting structure is illustrated. The combined enclosure and heat sink structure comprises an enclosure 220 comprising a first material and a heat sink 224 comprising a second material. The enclosure 220 and the heat sink 224 are coupled together by a sintering process. The combined enclosure and heat sink structure contains at least one, hollow, cooling channel 228. The hollow, cooling channel 228 extends to the edges 232 of the heat sink 224 to provide inlet and outlet points for fluid flow.

Figure 14:
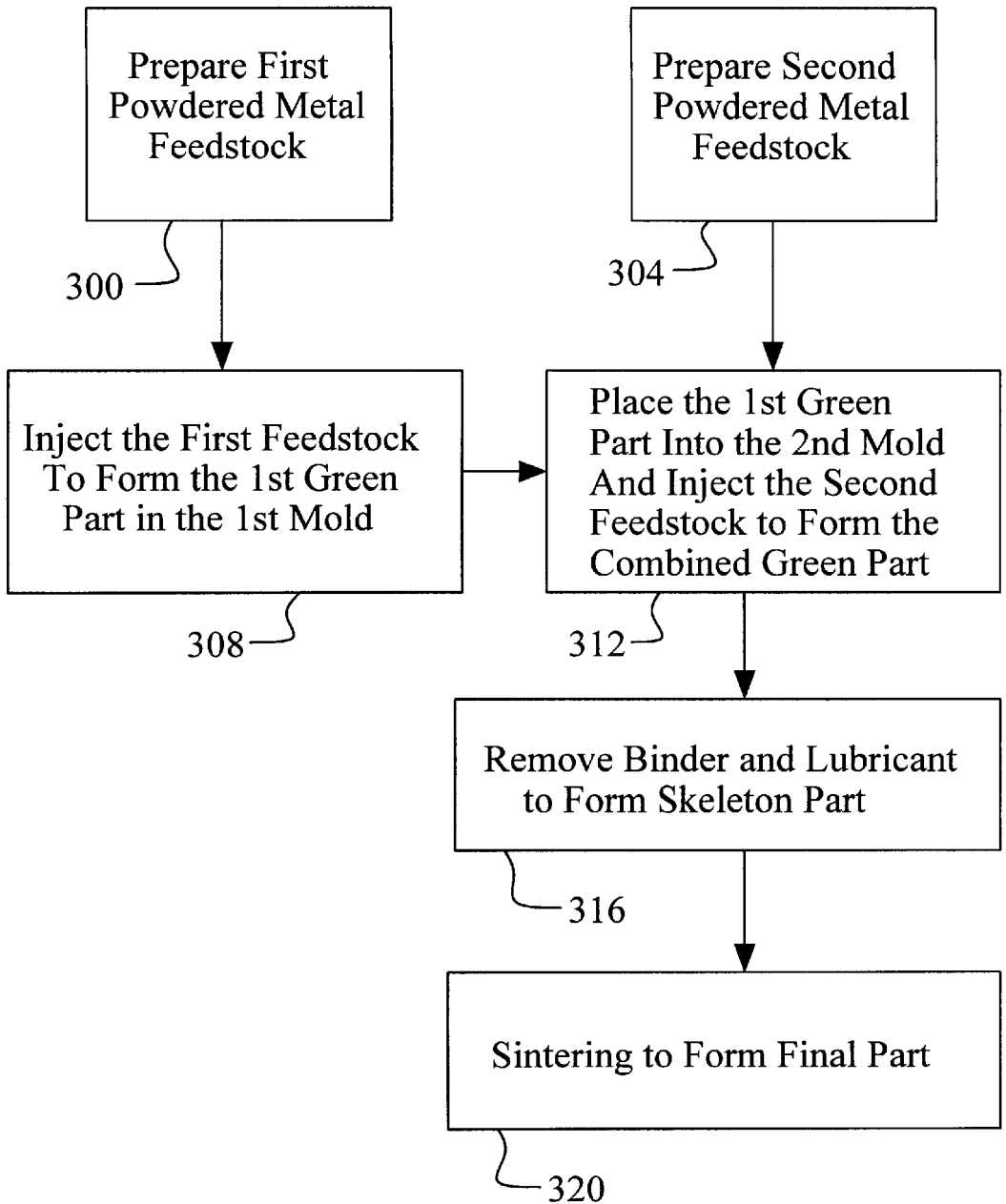
FIG. 14 illustrates a fourth preferred embodiment of the present invention where a second feedstock is injected into a mold containing a first green part.

Referring now to FIG. 14, a fourth preferred embodiment of the present invention is shown. In this case, a second feedstock is injected into a mold containing a first green part. A first feedstock comprising a first mixture of powdered metal materials, lubricants, and binders is prepared in step 300. A second feedstock comprising a second mixture of powdered metal materials, lubricants, and binders is prepared in step 304. The difference between the sintering shrinkage of first and second feedstock is less than 1%. The first feedstock is injected into a first mold. Thereafter, the first feedstock is pressed to form a first green part having an enclosure shape in step 308. The first green part is placed into a second mold. Then, the second feedstock is injected into the second mold. The second feedstock is pressed to form the first and second green parts wherein the first and second green parts now comprise a combined green part in step 312. The lubricants and the binders are removed from the first and second green parts to form a powdered skeleton in step 316. Finally, the powdered skeleton is sintered to complete the combined enclosure and heat sink structure in step 320.

Figure 15:
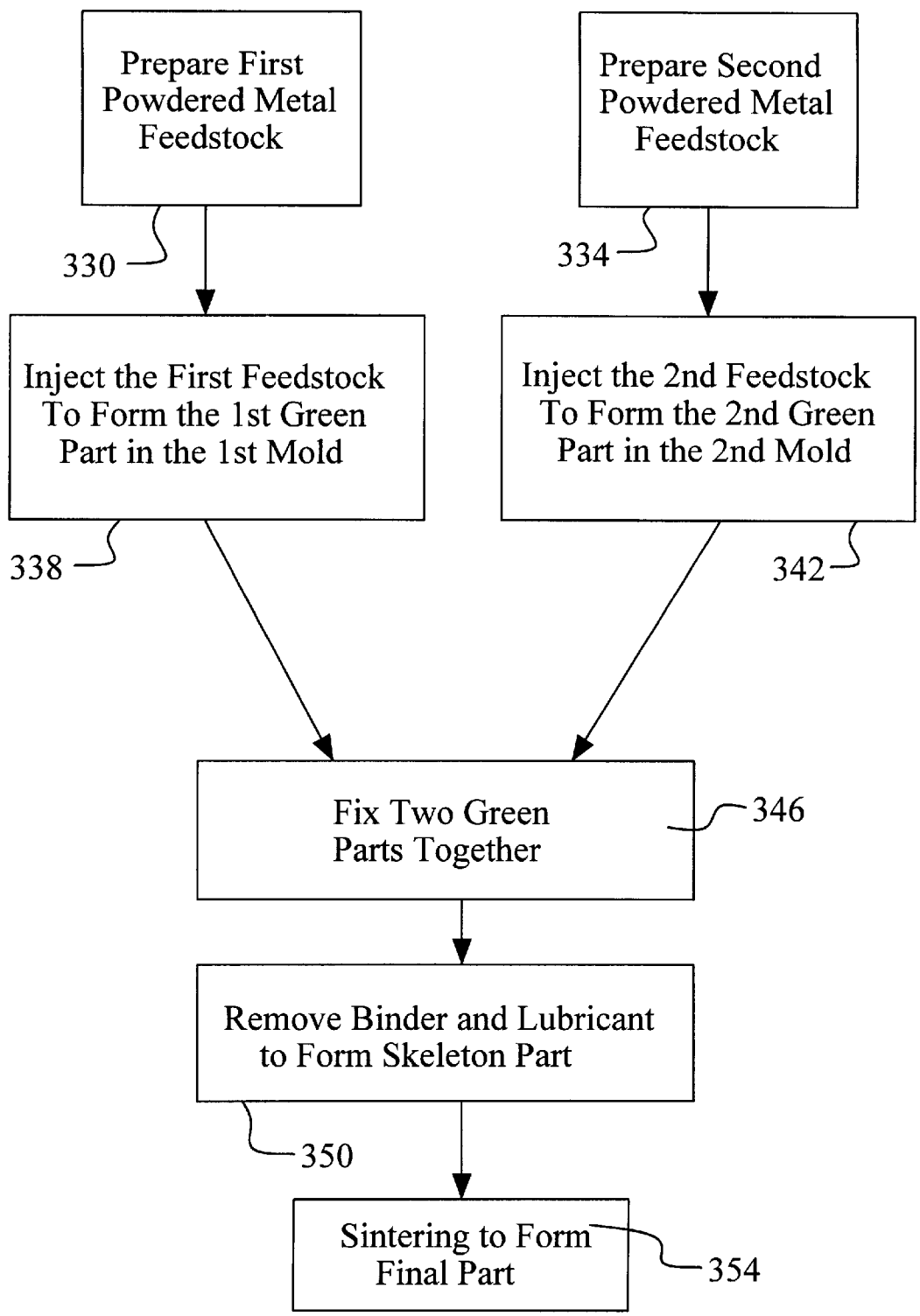
FIG. 15 illustrates a fifth preferred embodiment of the present invention where a first and a second green part are molded separately and then fixtured together during binder removal.

Referring now to FIG. 15, a fifth preferred embodiment of the present invention is shown. In this case, a first and a second green part are molded separately and then fixtured together during binder removal. A first feedstock comprising a first mixture of powdered metal materials, lubricants, and binders is prepared in step 330. A second feedstock comprising a second mixture of powdered metal materials, lubricants, and binders is prepared in step 334. The difference between the sintering shrinkage of first and second feedstock is less than 1%. The first feedstock is injected into a first mold. Thereafter, the first feedstock is pressed to form a first green part having an enclosure shape in step 338. The second feedstock is injected into a second mold. The second feedstock is pressed to form a second green part having a heat sink shape in step 342. The first and second green parts are fixtured together to form a combined green part in step 346. Then, the lubricants and the binders are removed from the combined green part to form a combined powdered skeleton in step 350. Finally, the powdered skeleton is sintered to complete the combined enclosure and heat sink structure in step 354.

Figure 16:
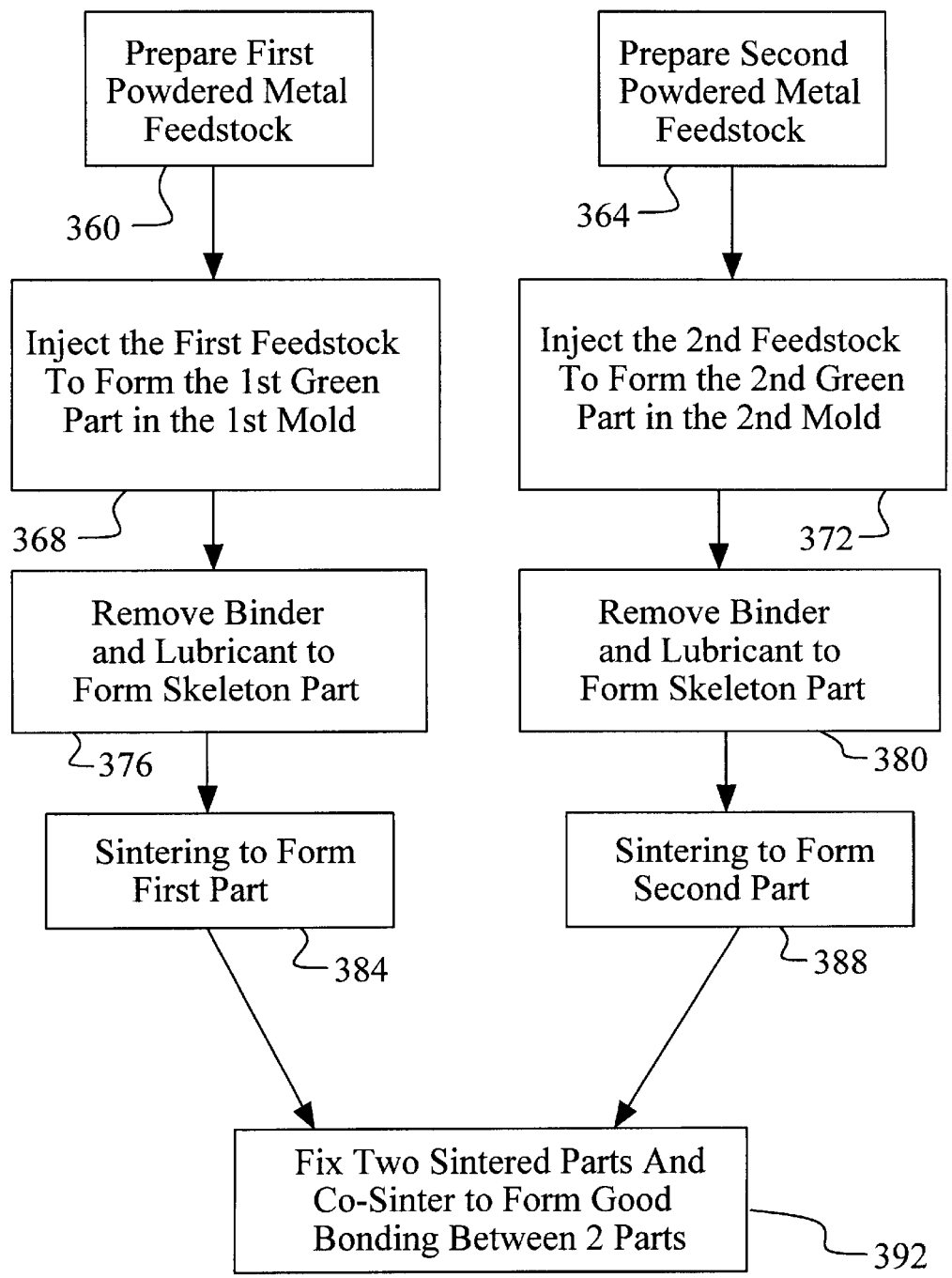
FIG. 16 illustrates a sixth preferred embodiment of the present invention where a first and a second skeleton part are formed separately and then fixtured together during sintering.

Referring now to FIG. 16 a sixth preferred embodiment of the present invention is shown where a first and a second skeleton part are formed separately and then fixtured together during sintering. A first feedstock comprising a first mixture of powdered metal materials, lubricants, and binders is prepared in step 360. A second feedstock comprising a second mixture of powdered metal materials, lubricants, and binders is prepared in step 364. The difference between the sintering shrinkage of first and second feedstock is less than 1%. The first feedstock is injected into a first mold. Thereafter, the first feedstock is pressed to form a first green part having an enclosure shape in step 368. The second feedstock is injected into a second mold. The second feedstock is pressed to form a second green part having a heat sink shape in step 372. Then, the lubricants and the binders are removed from the first green part to form a first powdered skeleton in step 376. The lubricants and the binders are removed from the second green part to form a second powdered skeleton in step 380. The first powdered skeleton is sintered to form a first part in step 384. The second powdered skeleton is sintered to form a second part in step 388. Finally, the first and second parts are fixtured together and then sintered together to complete the combined enclosure and heat sink structure in step 392.

Figure 17:
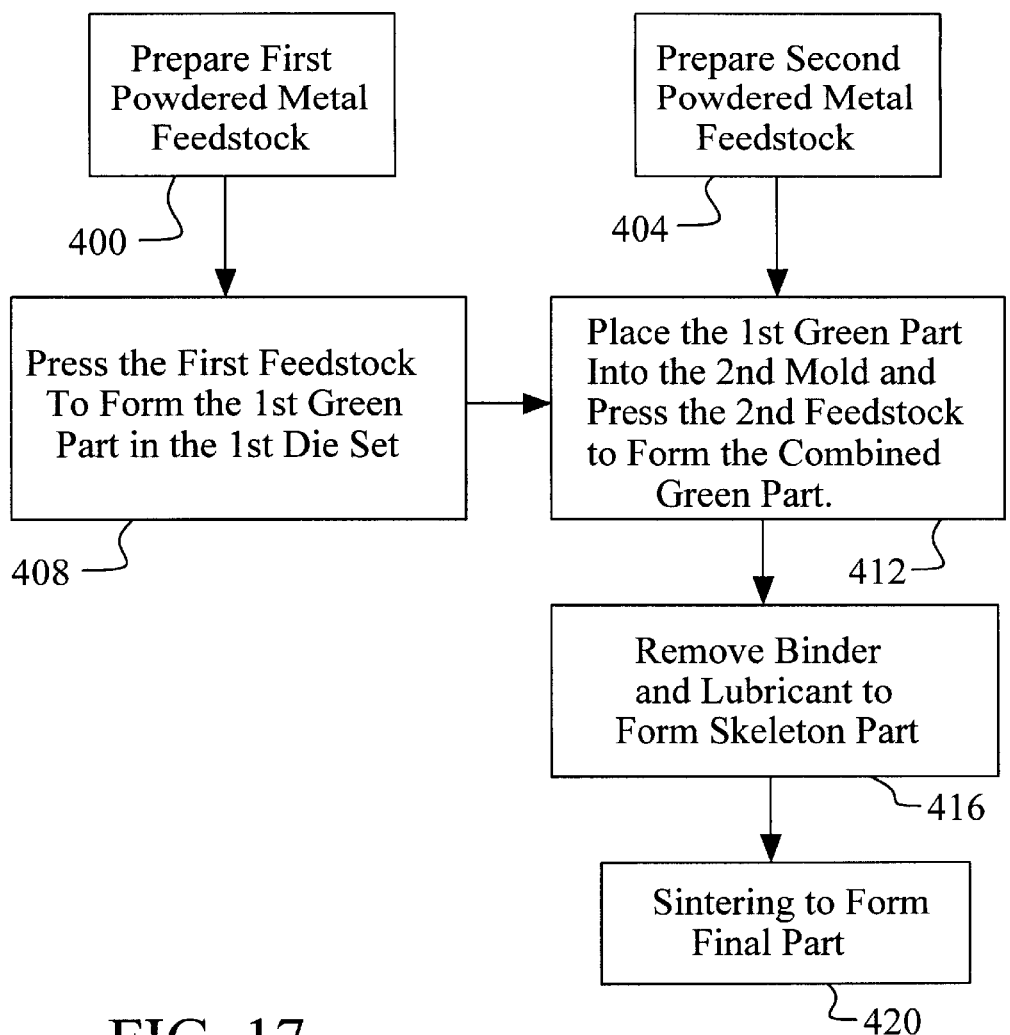
FIG. 17 illustrates a seventh preferred embodiment of the present invention where a second feedstock is injected into a die set containing a first green part.

FIG. 17 illustrates a seventh preferred embodiment of the present invention where a second feedstock is injected into a die set containing a first green part. A first feedstock comprising a first mixture of powdered metal materials, lubricants, and binders is prepared in step 400. A second feedstock comprising a second mixture of powdered metal materials, lubricants, and binders is prepared in step 404. The difference between the sintering shrinkage of first and second feedstock is less than 1%. The first feedstock is injected into a first mold. Thereafter, the first feedstock is pressed to form a first green part having an enclosure shape in step 408. The first green part is placed into a second mold. Then, the second feedstock is injected into the second mold. The second feedstock is pressed to form the first and second green parts wherein the first and second green parts now comprise a combined green part in step 412. The lubricants and the binders are removed from the first and second green parts to form a powdered skeleton in step 416. Finally, the powdered skeleton is sintered to complete the combined enclosure and heat sink structure in step 420.

Figure 18:
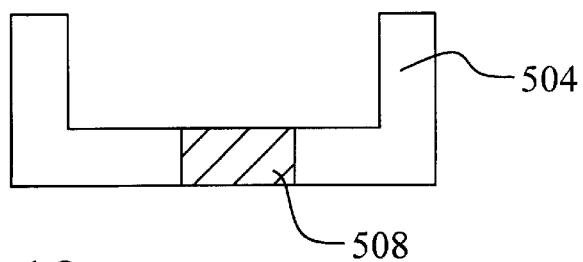
FIG. 18 illustrates an eight preferred embodiment of the present invention wherein a heat sink rod is press fit into the enclosure and then co-sintered into place.

Referring now to FIG. 18, an eight preferred embodiment of the present invention wherein a heat sink rod is press fit into the enclosure and then co-sintered into place is illustrated. This embodiment of the present invention is formed using the sixth embodiment method. In the sixth embodiment method, as shown in FIG. 16, the enclosure and the heat sink are formed separately. Then, the two parts are fixtured together and co-sintered in step 392. Referring again to FIG. 18, the combined enclosure and heat sink structure comprises an enclosure comprising, for example, Kovar or a low thermal expansion alloy. The heat sink comprises a tungsten-copper rod.

The present invention provides an effective and very manufacturable method to method to form an enclosure for a semiconductor device. The method forms an enclosure combined with a heat sink, without an adhesive layer therebetween, to reduce cost and to improve reliability. The combined enclosure and heat sink maintains low thermal expansion in the enclosure and high thermal conductivity in the heat sink. In addition, a method to form a combined enclosure and heat sink where a hollow, cooling channel is formed in the structure to further improve the heat sink thermal conductivity is provided. The cooling channel is formed by the same sintering process used to form the combined structure through the use of a fugitive plastic structure that is vaporized during sintering. An improved enclosure and heat sink structure is provided.

As shown in the preferred embodiments, the novel enclosure and heat sink methods and structures disclosed herein provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a combined enclosure and heat sink structure for a semiconductor device comprising:

preparing a first feedstock comprising a first mixture of powdered metal materials, lubricants, and binders;

preparing a second feedstock comprising a second mixture of powdered metal materials, lubricants, and binders such that the difference between the sintering shrinkage of each said first and second feedstock is less than 1%;

pressing said first and second feedstocks to form a first green part having an enclosure shape and a second green part having a heat sink shape;

removing said lubricants and said binders from said first and second green parts to form a first powdered skeleton and a second powdered skeleton; and sintering said first and second powdered skeletons to complete said combined enclosure and heat sink structure wherein said first and second powdered skeletons are in intimate contact during said sintering.

2. The method according to claim 1 wherein said step of pressing comprises:

injecting said first feedstock and said second feedstock into a combination mold; and thereafter pressing said first feedstock and said second feedstock to form said first and second green parts wherein said first and second green parts comprise a combined green part.

3. The method according to claim 1 wherein said step of pressing comprises:

injecting said first feedstock into a first mold;

thereafter pressing said first feedstock to form a first green part having an enclosure shape;

injecting said second feedstock into a second mold; and thereafter pressing said second feedstock to from a second green part having a heat sink shape.

4. The method according to claim 1 wherein said step of pressing comprises:

injecting said first feedstock into a first mold;

thereafter pressing said first feedstock to form a first green part;

placing said first green part into a second mold;

thereafter injecting said second feedstock into said second mold; and thereafter pressing said second feedstock to form said first and second green parts wherein said first and second green parts comprise a combined green part.

5. The method according to claim 1 wherein said first and second green parts comprise a combined green part.

6. The method according to claim 1 wherein said first and second powdered metal skeletons comprise a combined powdered metal skeleton.

7. The method according to claim 1 wherein said first mixture of powdered materials comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

8. The method according to claim 1 wherein said second mixture of powdered materials comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

9. The method according to claim 1 wherein said step of sintering comprises heating at a temperature of between about 1000° C. and 1600° C. for between about 30 minutes and 180 minutes.

10. The method according to claim 1 wherein a fugitive plastic structure is encapsulated by at least one of said first and second powdered skeletons and wherein said fugitive plastic structure is burned away during said step of sintering to thereby form at least one, hollow, cooling channel in said combined enclosure and heat sink structure.

11. The method according to claim 10 wherein said fugitive plastic structure comprises a plastic material selected from the group consisting of: thermosetting polymers, thermoplastic polymers, cellulose, wax, gelatin, and glycol.

12. A method to form a combined enclosure and heat sink structure for a semiconductor device comprising:

preparing a first feedstock comprising a first mixture of powdered metal materials, lubricants, and binders;

preparing a second feedstock comprising a second mixture of powdered metal materials, lubricants, and binders such that the difference between the sintering shrinkage of each said first and second feedstock is less than 1%;

injecting said first feedstock and said second feedstock into a combination mold;

thereafter pressing said first feedstock and said second feedstock to form a combined green part having an enclosure shape and a heat sink shape;

removing said lubricants and said binders from said combined green part to form a combined powdered skeleton; and sintering said powdered skeleton to complete said combined enclosure and heat sink structure.

13. The method according to claim 12 wherein said first mixture of powdered materials comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

14. The method according to claim 12 wherein said second mixture of powdered materials comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

15. The method according to claim 12 wherein said step of sintering comprises heating at a temperature of between about 1000° C. and 1600° C. for between about 30 minutes and 180 minutes.

16. The method according to claim 12 wherein a fugitive plastic structure is encapsulated by said combined powdered skeleton and wherein said fugitive plastic structure is burned away during said step of sintering to thereby form at least one, hollow, cooling channel in said combined enclosure and heat sink structure.

17. The method according to claim 16 wherein said fugitive plastic structure comprises a plastic material selected from the group consisting of: thermosetting polymers, thermoplastic polymers, cellulose, wax, gelatin, and glycol.

18. A method to form a combined enclosure and heat sink structure for a semiconductor device comprising:

preparing a first feedstock comprising a first mixture of powdered metal materials, lubricants, and binders;

preparing a second feedstock comprising a second mixture of powdered metal materials, lubricants, and binders such that the difference between the sintering shrinkage of each said first and second feedstock is less than 1%;

injecting said first feedstock into a first mold;

thereafter pressing said first feedstock to form a first green part having an enclosure shape;

injecting said second feedstock into a second mold;

thereafter pressing said second feedstock to form a second green part having a heat sink shape;

fixturing together said first and second green parts to form a combined green part;

thereafter removing said lubricants and said binders from said combined green part to form a combined powdered skeleton; and sintering said powdered skeleton to complete said combined enclosure and heat sink structure.

19. The method according to claim 18 wherein said first mixture of powdered materials comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

20. The method according to claim 18 wherein said second mixture of powdered materials comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

21. The method according to claim 18 wherein said step of sintering comprises heating at a temperature of between about 1000° C. and 1600° C. for between about 30 minutes and 180 minutes.

22. The method according to claim 18 wherein a fugitive plastic structure is encapsulated by said combined powdered skeleton and wherein said fugitive plastic structure is burned away during said step of sintering to thereby form at least one, hollow, cooling channel in said combined enclosure and heat sink structure.

23. The method according to claim 22 wherein said fugitive plastic structure comprises a plastic material selected from the group consisting of: thermosetting polymers, thermoplastic polymers, cellulose, wax, gelatin, and glycol.

24. A method to form a combined enclosure and heat sink structure for a semiconductor device comprising:

preparing a first feedstock comprising a first mixture of powdered metal materials, lubricants, and binders;

preparing a second feedstock comprising a second mixture of powdered metal materials, lubricants, and binders such that the difference between the sintering shrinkage of each said first and second feedstock is less than about 1%;

injecting said first feedstock into a first mold;

thereafter pressing said first feedstock to form a first green part;

placing said first green part into a second mold;

thereafter injecting said second feedstock into said second mold;

thereafter pressing said second feedstock to form said first and second green parts wherein said first and second green parts comprise a combined green part;

removing said lubricants and said binders from said first and second green parts to form a powdered skeleton; and sintering said powdered skeleton to complete said combined enclosure and heat sink structure.

25. The method according to claim 24 wherein said first mixture of powdered materials comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

26. The method according to claim 24 wherein said second mixture of powdered materials comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

27. The method according to claim 24 wherein said step of sintering comprises heating at a temperature of between about 1000° C. and 1600° C. for between about 30 minutes and 180 minutes.

28. The method according to claim 24 wherein a fugitive plastic structure is encapsulated by said combined powdered skeleton and wherein said fugitive plastic structure is burned away during said step of sintering to thereby form at least one, hollow, cooling channel in said combined enclosure and heat sink structure.

29. The method according to claim 28 wherein said fugitive plastic structure comprises a plastic material selected from the group consisting of: thermosetting polymers, thermoplastic polymers, cellulose, wax, gelatin, and glycol.

30. A method to form a combined enclosure and heat sink structure for a semiconductor device comprising:

preparing a first feedstock comprising a first mixture of powdered metal materials, lubricants, and binders;

preparing a second feedstock comprising a second mixture of powdered metal materials, lubricants, and binders such that the difference between the sintering shrinkage of each said first and second feedstock is less than about 1%;

injecting said first feedstock into a first mold;

thereafter pressing said first feedstock to form a first green part;

injecting said second feedstock into a second mold;

thereafter pressing said second feedstock to from a second green part having a heat sink shape;

removing said lubricants and said binders from said first and second green parts to form a first powdered skeleton and a second powdered skeleton; and sintering said first powdered skeleton to form an enclosure;

sintering said second powdered skeleton to form a heat sink;

fixturing together said enclosure and said heat sink; and thereafter co-sintering said enclosure and said heat sink to complete said combined enclosure and heat sink structure.

31. The method according to claim 30 wherein said first mixture of powdered materials comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

32. The method according to claim 30 wherein said second mixture of powdered materials comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic raphite, and silver.

33. The method according to claim 30 wherein said step of sintering comprises heating at a temperature of between about 1000° C. and 1600° C. for between about 30 minutes and 180 minutes.

34. The method according to claim 30 wherein a fugitive plastic structure is encapsulated by at least one of said first and second powdered skeletons and wherein said fugitive plastic structure is burned away during said step of sintering to thereby form at least one, hollow, cooling channel in said combined enclosure and heat sink structure.

35. The method according to claim 34 wherein said fugitive plastic structure comprises a plastic material selected from the group consisting of: thermosetting polymers, thermoplastic polymers, cellulose, wax, gelatin, and glycol.

36. The method according to claim 30 wherein said fixturing together comprises a press fit of said heat sink into said enclosure.

37. A combined enclosure and heat sink structure for a semiconductor device comprising:

an enclosure comprising a first material; and a heat sink comprising a second material wherein said enclosure and said heat sink are coupled together by a sintering process comprising:
  preparing a first feedstock comprising a first mixture of powdered metal materials, lubricants, and binders;
  preparing a second feedstock comprising a second mixture of powdered metal materials, lubricants, and binders such that the difference between the sintering shrinkage of each said first and second feedstock is less than 1%;
  pressing said first and second feedstocks to form a first green part having an enclosure shape and a second green part having a heat sink shape;
  removing said lubricants and said binders from said first and second green parts to form a first powdered skeleton and a second powdered skeleton; and
  sintering said first and second powdered skeletons to complete said combined enclosure and heat sink structure wherein said first and second powdered skeletons are in intimate contact during said sintering.

38. The structure according to claim 37 wherein said first material comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

39. The structure according to claim 37 wherein said second material comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

40. The structure according to claim 37 wherein said combined enclosure and heat sink structure contains at least one, hollow, cooling channel.

41. An combined enclosure and heat sink structure for a semiconductor device comprising:

an enclosure comprising a first material; and a heat sink comprising a second material wherein said enclosure and said heat sink are coupled together by a sintering process and wherein said combined enclosure and heat sink structure contains at least one, hollow, cooling channel.

42. The structure according to claim 41 wherein said first material comprises one or more materials selected from the group consisting of: nickel, cobalt, iron, molybdenum, stainless steel, tungsten, tungsten-copper, molybdenum, molybdenum-copper, aluminum, aluminum nitride, alumina, and Kovar.

43. The structure according to claim 41 wherein said second material comprises one or more materials selected from the group consisting of: aluminum, copper, tungsten-copper, molybdenum-copper, aluminum nitride (ceramic), gold, beryllium, magnesium, silicon, tungsten, molybdenum, tin, zinc, pyrolytic graphite, and silver.

* * * * *